(12) United States Patent
Kostelnik et al.

(10) Patent No.: US 9,087,636 B2
(45) Date of Patent: Jul. 21, 2015

(54) METHOD FOR PRODUCING A COIL

(71) Applicants: Würth Elektronik Gmbh & Co. KG, Niedernhall (DE); Hahn-Schickard-Gesellschaft für angewandte Forschung e.V., Villingen-Schwenningen (DE)

(72) Inventors: Jan Kostelnik, Kirchberg (DE); Alina Schreivogel, Schwieberdingen (DE); Jürgen Wolf, Kupferzell (DE); Jürgen Keck, Filderstadt (DE); Metin Giousouf, Esslingen (DE); Thomas Reininger, Nürtingen (DE); Albert Kiessling, Weil der Stadt (DE)

(73) Assignee: WURTH ELECTRONIK GMBH & CO., Niedernhall (DE)

( * ) Notice: Subject to any disclaimer, the term of this patent is extended or adjusted under 35 U.S.C. 154(b) by 0 days.

(21) Appl. No.: 14/069,413

(22) Filed: Nov. 1, 2013

(65) Prior Publication Data

US 2014/0132386 A1    May 15, 2014

(30) Foreign Application Priority Data

Nov. 2, 2012 (DE) .......................... 10 2012 220 022

(51) Int. Cl.
| | |
|---|---|
| H01F 7/06 | (2006.01) |
| H01F 27/28 | (2006.01) |
| H05K 1/16 | (2006.01) |
| H01F 41/04 | (2006.01) |
| H01F 17/00 | (2006.01) |
| H03K 17/95 | (2006.01) |
| H05K 3/12 | (2006.01) |

(52) U.S. Cl.
CPC ........ *H01F 27/2804* (2013.01); *H01F 17/0006* (2013.01); *H01F 41/042* (2013.01); *H01F 41/043* (2013.01); *H05K 1/165* (2013.01); *H01F 2017/0066* (2013.01); *H03K 17/9505* (2013.01); *H03K 2017/9527* (2013.01); *H05K 3/125* (2013.01); *H05K 2201/086* (2013.01); *H05K 2201/09036* (2013.01); *H05K 2203/1344* (2013.01); *Y10T 29/4902* (2015.01)

(58) Field of Classification Search
USPC ........ 29/592.1, 602.1, 603.23, 606, 831, 832, 29/837; 336/65, 83, 90–96, 200, 206–208, 336/323
See application file for complete search history.

(56) References Cited

U.S. PATENT DOCUMENTS

| | | | |
|---|---|---|---|
| 4,522,671 | A | 6/1985 | Grunwald et al. |
| 5,336,921 | A | 8/1994 | Sundaram et al. |
| 7,477,128 | B2 * | 1/2009 | Quilici .......................... 336/223 |

(Continued)

OTHER PUBLICATIONS

Office Action in the European Patent Office, EP 13 19 0891, Dated Feb. 11, 2014, 7 pages.

*Primary Examiner* — Paul D Kim
(74) *Attorney, Agent, or Firm* — Cesari & Reed LLP; R. Michael Reed (57) ABSTRACT

The invention relates to a method for producing a coil (140) integrated in a substrate (100) or applied to a substrate, wherein the coil has first winding portions (136), which each have first ends (141) and second ends (147), and wherein the coil has second winding portions (138) and third winding portions (139), wherein each two of the first ends are electrically interconnected by the second winding portions and two corresponding second ends of the first winding portions are electrically interconnected by the third winding portions, such that coil windings of the coil are formed hereby, wherein at least the first winding portions are applied by means of a 3D printing method, wherein this is aerosol jet or inkjet printing, for example.

22 Claims, 5 Drawing Sheets

(56) References Cited

U.S. PATENT DOCUMENTS

| | | | |
|---|---|---|---|
| 8,169,285 B2 * | 5/2012 | Hoglauer et al. | 336/200 |
| 2005/0122199 A1 * | 6/2005 | Ahn et al. | 336/200 |
| 2007/0063807 A1 | 3/2007 | Quilici | |
| 2008/0252407 A1 | 10/2008 | Anderson | |
| 2008/0290992 A1 | 11/2008 | Hoeglauer et al. | |

* cited by examiner

Fig. 13

METHOD FOR PRODUCING A COIL

CROSS-REFERENCE TO RELATED APPLICATION(S)

This application is a national stage application of and claims priority to pending German Patent Application No. 10 2012 220 022.3, filed on Nov. 2, 2012, and entitled "Verfahren zur Herstellung einer Spule and elektronisches Gerät".

FIELD OF THE DISCLOSURE

The invention relates to a method for producing a coil integrated in a substrate or applied to a substrate, in particular a method for producing an electronic printed circuit board, and also an electronic device comprising such an electronic printed circuit board.

BACKGROUND

Planar coils in which the coil windings are applied to the surface of a substrate are known per se from the prior art. Only a relatively low inductance can be achieved cost-efficiently with such planar coils, wherein the planar coils additionally take up a relatively large amount of space on the substrate surface.

Embedded Faltflex coils are known from www.elektroniknet.de, 26 Apr. 2012, "Embedding von aktiven and passive Bauteilen in die Leiterplatte" ("Embedding of active and passive components into the printed circuit board"). Here, flexible film structures are folded such that coils can be produced in any size with a practically arbitrary number of layers. This is particularly advantageous for sensor applications.

A coil structure for a printed circuit board arrangement is known from DE 43 06 416 A1. A winding of the coil is formed by metallized bores and conductive track portions. A ferrite core can be introduced laterally in a slit in the printed circuit board. Alternatively, the inner layers of the printed circuit board can be used directly as a support for imprinted core structures. A disadvantage with this coil structure is that on the one hand it is not suitable for miniaturization, and on the other hand large inductances cannot be achieved therewith.

An inductive sensor having a coil for generating a magnetic field is known from DE 103 54 694 A1. The coil is formed by two layers, between which a strip of an amorphous metal is located as a coil core. The coil windings are formed by conductive track portions arranged on the layers and by through-contactings, which run past on the coil core.

An inductive sensor which has a coil generating a magnetic field, the core of said coil being provided in an aperture in a circuit carrier, is known from DE 103 55 003 A1.

SUMMARY

By contrast, the object of the present invention is to create an improved method for producing a coil integrated in a substrate or applied to a substrate, in particular for producing a printed circuit board, and also an electronic device comprising such a coil.

The objects forming the basis of the invention are each achieved by the features in the respective independent patent claims. Embodiments of the invention are specified in the dependent patent claims.

In accordance with embodiments of the invention, at least the first winding portions are applied by means of a 3D printing method, in particular also the second winding portions and/or the third winding portions.

Here, a "3D printing method" is understood to mean any printing method which enables three-dimensional electrical line structures to be applied by means of printing, such as aerosol jet or inkjet printing methods. In the 3D printing method, electrically conductive inks, in particular an electrically conductive polymer, silver conductive past or the like, is used in order to apply the line structures by means of printing.

Embodiments of the invention are particularly advantageous since the use of a 3D printing method makes it possible to introduce miniaturized coils into a substrate or to apply such coils to a substrate, moreover at relatively low production costs and high throughput. In particular, the production of miniaturized coil arrays of high resolution and sensitivity is thus enabled, in particular for the production of sensors, such as inductive proximity sensors, or actuators.

In accordance with embodiments of the invention, the following approach for production of a coil is adopted, for example:

1. A substrate is first provided. The substrate may be a printed circuit board material, in particular fiber-reinforced plastic, in particular a glass fiber mat saturated with epoxy resin, for example what is known as an FR-4 material.
2. A cavity is produced in the substrate and for example is open toward the front face of the substrate. The cavity can be produced in the substrate by material-removing processing of the substrate, for example by removing the material with the aid of a laser or by a machining process, preferably by milling and also by hot foil stamping. The cavity has a base area, which for example runs parallel to the surface of the substrate, and also lateral flanks, which connect the base area to the surface of the substrate.
3. Once the cavity has been produced, the first and second winding portions of the coil are introduced into the cavity. The first winding portions run along the flanks of the cavity and extend from the base area to the surface of the substrate. The second winding portions run along the base area, where they each contact two ends of the first winding portions. The following approach for example can be adopted in order to introduce the first and second winding portions:
    a) The two winding portions are first formed on the base area, for example more specifically by a conventional structuring technique, in particular the application of a copper layer and subsequent etching, or by a two-dimensional printing method, such as screen printing. The first winding portions are then applied to the flanks of the cavity by means of the 3D printing method. Alternatively, the first winding portions may also be applied, and then the second winding portions.
    b) The first and second winding portions are applied to the base area and the flanks of the cavity in one process step with the aid of the 3D printing method.
4. The cavity is then filled with a core material, for example a paste, which contains ferromagnetic particles. Here, a paste is understood to mean a mixture of a particle and a liquid, for example a solvent, for example a suspension. Due to the introduced paste, a core material is formed in the cavity and serves to produce a coil core. Alternatively, the core material may also be introduced in the form of a solid into the cavity, for example by being pressed in.
5. The third winding portions are applied to the surface of the resultant coil core, more specifically for example by a structuring technique, in particular etching, or by means of a printing method, in particular a 2D printing method.

By contrast, in accordance with embodiments of the invention, the following approach for example is adopted in order to apply a coil to a substrate:

1. A substrate is first provided. The substrate may be a printed circuit board material, in particular fiber-reinforced plastic, in particular a glass fiber mat saturated with epoxy resin, for example what is known as an FR-4 material.
2. The second winding portions are applied to the surface of the substrate, for example by means of a structuring technique or a two-dimensional printing method.
3. In the region of the second winding portions, core material is then applied to the surface of the substrate, with the result that the core material covers the second winding portions. The core material can be applied similarly to the above-mentioned step 4 by applying a paste, for example using a dispenser, or by applying a solid.
4. The first and third winding portions of the coil are then applied, wherein the first winding portions extend along the lateral flanks of the coil core and the third winding portions extend over the surface of the coil core. To this end, one of the following embodiments specified hereinafter can be adopted for example:
  a) The first and third winding portions are applied in one process step by means of a 3D printing method.
  b) Only the first winding portions are applied by means of a 3D printing method, whereas the third winding portions are applied for example by means of a structuring method or two-dimensional printing method.

Different coil geometries can be produced in this way, such as a cylindrical coil, of which the coil axis runs parallel to the surface of the substrate, or an annular or toroidal coil, which is oriented parallel to the surface of the substrate.

In accordance with an embodiment of the invention, the coil core in the cavity is annular, toroidal, or disk-shaped, wherein the coil core may have a round or angular shape. Due to the selection of other geometries of the cavity and therefore of the coil core, the magnetic field to be generated by the coil can be optimized for the respective application.

In accordance with an embodiment of the invention, the cavity has a base area parallel to the surface of the substrate. Lateral flanks run out from the base area and form the opening of the cavity. The lateral flanks preferably form a right angle or an acute angle with the surface of the substrate, for example an angle between 30 and 60°, preferably 45°.

Such an angle has the surprising advantage that air pockets are avoided when introducing the paste into the cavity, since the air can escape along the lateral flanks during the introduction process. This is particularly advantageous when the paste is pressed into the cavity, for example by means of screen printing, intaglio printing, pad printing, or with the aid of a dispenser.

It has surprisingly proven to be particularly advantageous when the paste is introduced by means of screen printing and the lateral flanks of the cavity enclose an angle of approximately 45° with the surface.

In accordance with an embodiment of the invention, the particles consist of a soft magnetic amorphous and/or nanocrystalline alloy.

Here, particles which have a nanocrystalline structure are particularly advantageous, since this leads to a very high permeability with a small coercive force. Further advantages of such nanocrystalline materials are outstanding magnetic values, cost-effective alloy compositions, very good temperature stability, and very favorable frequency properties. The nanocrystalline particles can be composed from a soft magnetic metal alloy, for example based on Fe, Si and/or B with additions of Nb and/or Cu.

In accordance with an embodiment of the invention, a plurality of the integrated coils are produced in the substrate in this way. These coils can be connected for example to a sensor array, for example in order to produce a highly sensitive inductive position sensor.

In accordance with a further embodiment, the second winding portions can be imprinted. The second winding portions can be imprinted for example by means of conductive inks: further circuit components, which may be formed by means of electrically conductive polymer, may likewise be imprinted on the substrate in order to connect this to the one or more coils.

In accordance with a further embodiment, the cavity is produced by a hot foil stamping technique.

In accordance with an embodiment of the invention, a "cavity" is understood to mean a recess from the substrate or an aperture through two or more substrates, arranged one above the other, of a multi-layer printed circuit board, that is to say what is known as a multi-layer PCB, wherein one of the substrates arranged one above the other forms the base area.

In accordance with an embodiment of the invention, the coil core is first produced separately as a solid, and is then secured in the cavity, for example in a form-locked and/or force-locked manner, for example by being pressed into the cavity.

The coil cores can be produced for example by extrusion of a polymer/ferrite composite material. For example, endless profiles formed from the polymer/ferrite composite material are produced by the extrusion process, from which individual coil cores are obtained by separating portions of the extrusion profile.

Such an extrudate can be produced as a flexible band and can be applied by means of an adhesive to the substrate, more specifically in particular where a higher overall thickness can be tolerated. In this case, the coil core may thus also extend beyond the surface of the substrate, wherein mixed forms are also possible, for example the filling of the cavity in the substrate with a pasty or liquid material and then, once this has cured, the application of one or more material layers thereof or of another core material to the already filled cavity. Such an additional film could also be adhered to one side of a printed circuit board, in particular a multi-layer PCB, which is then in particular advantageous if the sensor is to be arranged on the end face.

In accordance with an embodiment of the invention, the cross section of a cavity or of the coil core may have different geometric shapes, which may be symmetrical or asymmetrical. The shape of the cavity and therefore the shape of the coil core can be selected here such that the magnetic field obtains a geometry and strength optimized for the respective application.

Besides a rectangular shape, the coil core can be formed for example in a triangular, round or spherical manner. Such geometric shapes of the cavity can be produced for example by milling out material or by water jet cutting, and the filling of the cavity with the core material can be achieved for example by printing, in particular by inkjet printing.

Furthermore, it is also possible for the core material within the coil core to vary locally in order to achieve a desired shape of the magnetic field, wherein such a local variation of the material composition in the coil core can be achieved for example by imprinting different core materials in layers.

In accordance with an embodiment of the invention, the cavity extends over a plurality of substrate layers in the vertical direction, wherein the vias, that is to say the through-contactings, can be produced for example by drilling, lasering, plasma-treating or water jet cutting. Combinations of such techniques are also possible, for example water jet cutting with laser guidance.

Embodiments of the invention allow the production of miniaturized coils with the aid of cost-effective structuring and production techniques capable of high-throughput, as are suitable for mass production.

In accordance with an embodiment of the invention, the substrate contains glass fibers, which are present in the substrate along one or more preferred directions, for example in the form of a glass fiber matrix, or in an unordered manner; in particular, the substrate may be a glass-fiber-reinforced printed circuit board material.

In this case, glass fibers are severed due to the introduction of the cavity into the substrate, with the result that the cavity has an accordingly rough surface finish. To smooth the surface of the cavity, a material is introduced into the cavity before the introduction of the first and second winding portions, said material extending over the flanks and the base area of the cavity. For example, the cavity is completely filled with the material. The material may be a plastic, a resin or another insulator.

This material is then removed again in part from the cavity, for example by machining or by application of a laser jet. A layer of the material extending over the flanks and the base area remains in the cavity.

Since the material contains no glass fibers, it has an accordingly smooth surface, that is to say the roughness of the surface of this material layer is lower than the roughness of the flanks and the base area of the cavity. For example, the layer thickness of this material layer may be less than 30 μm, in particular between 10 μm and 20 μm.

The first and second winding portions are then applied to this material layer. Surprisingly, the resultant coil then has an improved coil quality.

This is explained by the fact that, when applying the first and second winding portions directly to the flanks or the base area by means of the 3D printing method, the imprinted winding portions have a reduced effective line cross section, which is caused by the roughness of the surface. This reduced effective line cross section leads to an increase of the ohmic resistance and therefore to a reduction of the coil quality.

In accordance with embodiments of the invention, this problem is remedied in that the flanks and the base area of the cavity are smoothed by application of the material layer, and in that the first and second winding portions are not applied directly to the flanks and the base area, but to the material layer extending over the flanks and the base area.

BRIEF DESCRIPTION OF THE DRAWINGS

Embodiments of the invention will be explained in greater detail hereinafter with reference to the drawings, in which.

Corresponding or identical elements in the following exemplary embodiments are denoted in each case by the same reference signs.

DETAILED DESCRIPTION

Figure 1:
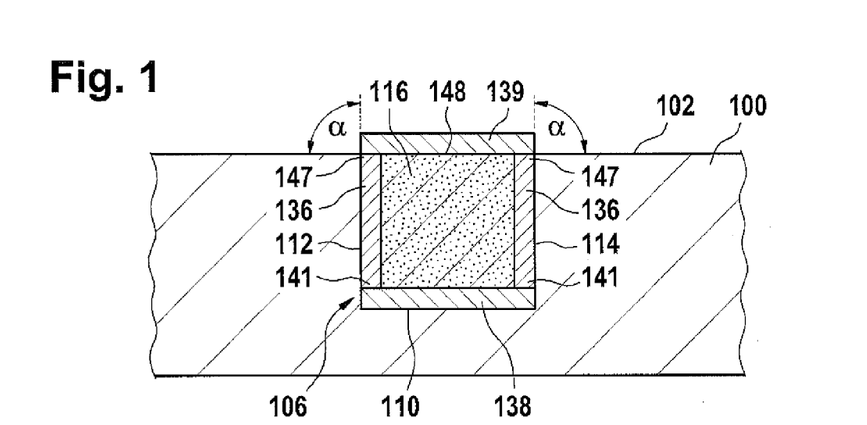
FIG. 1 shows a schematic cross section of an electronic printed circuit board according to the invention with an integrated coil.

FIG. 1 shows a substrate 100, which may be a printed circuit board material, for example with glass-fiber reinforcement. For integration of a coil 140 (see FIG. 2) into the substrate 100, a cavity 106 is first produced in the substrate 100, whereby a surface 102 of the substrate 100 is opened.

For example, the cavity 106 is produced in the substrate 100 by a machining process by milling the cavity 106 into the substrate 100. A base area 110 of the cavity 106, which for example runs parallel to the surface 102, is thus produced. Furthermore, lateral flanks 112 and 114 of the cavity 116, which each enclose an angle α with the surface 102, are further produced as a result. The angle α may be a right angle (as shown in FIG. 1) or an acute angle, in particular an angle of less than 50°, for example 45°.

In the next step, the first winding portions 136 are applied to the flanks 112 and 114, and the second winding portions 138 are applied to the base area 110 of the cavity 106.

This can be implemented in such a way that the first winding portions 136 and the second winding portions 138 are applied in a single process step by a 3D printing method, in particular by aerosol jet or inkjet printing. This can occur in the form of a conductive polymer.

The cavity 106 is then filled with a core material so as to form the coil core, for example is filled with a paste 116, which contains ferromagnetic particles. Once the paste 116 has cured, third winding portions 139 are applied to the upper face 148 of the coil core formed by the cured paste, for example by means of a structuring technique or a two-dimensional printing method.

The first winding portions 136 each have a lower first end 141 and an upper second end 147. Each two of the first ends 141 of two of the first winding portions 136 are electrically connected by one of the second winding portions 138, whereas two corresponding second ends 147 of two different first winding portions 136 are electrically contacted by the third winding portions 139, thus resulting in an approximately helical coil winding to form the coil 140.

The paste 116 can likewise be introduced into the cavity 106 by means of printing. A selection of the angle α of 45° is particularly advantageous when the paste 116 is introduced by means of screen printing, since the formation of air pockets in the paste 116 is then prevented in a particularly efficient manner. The paste 116 may further be acted on during the curing process with ultrasound or other vibrations in order to prevent slug formation as the paste 116 cures. Alternatively, the coil core can be formed by a solid instead of by the paste 116, said solid being introduced into the cavity 106.

Figure 2:
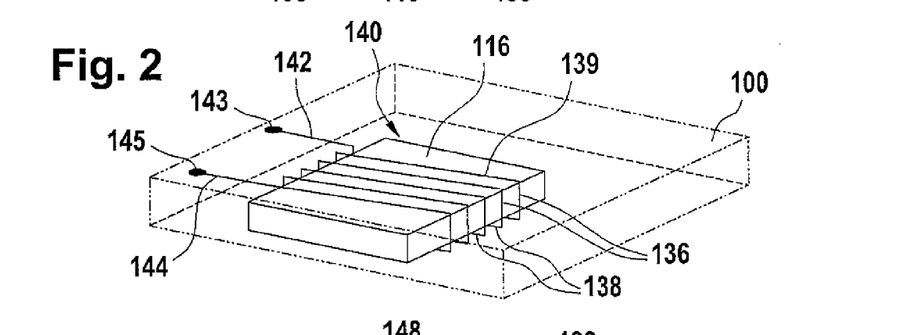
FIG. 2 shows a perspective view of the printed circuit board according to FIG. 1.

FIG. 2 shows a perspective view of the resultant printed circuit board 100 with the integrated coil 140.

Figure 3:
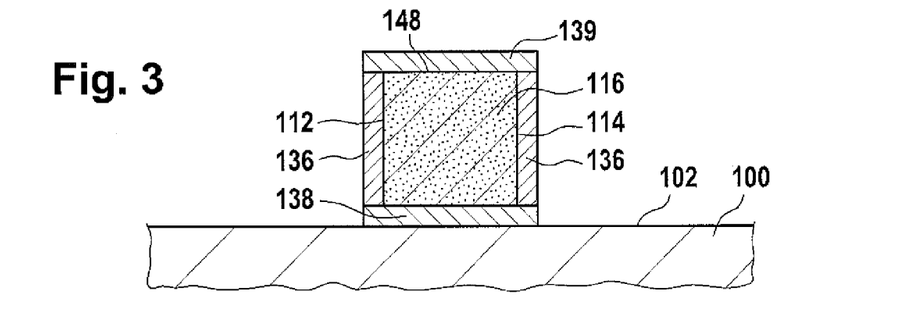
FIG. 3 shows a schematic cross section of an embodiment of a printed circuit board according to the invention with an applied coil.

FIG. 3 shows an alternative embodiment, in which the coil 140 is applied to the substrate 100. To this end, the second winding portions 138 are first applied to the substrate 100. The core material, for example in the form of the paste 116 or as a solid, is then applied to the second winding portions 138, wherein the core material covers the second winding portions 138, at least in part, for example as far as edge regions of the second winding portions 138, as shown in FIG. 3.

Figure 4:
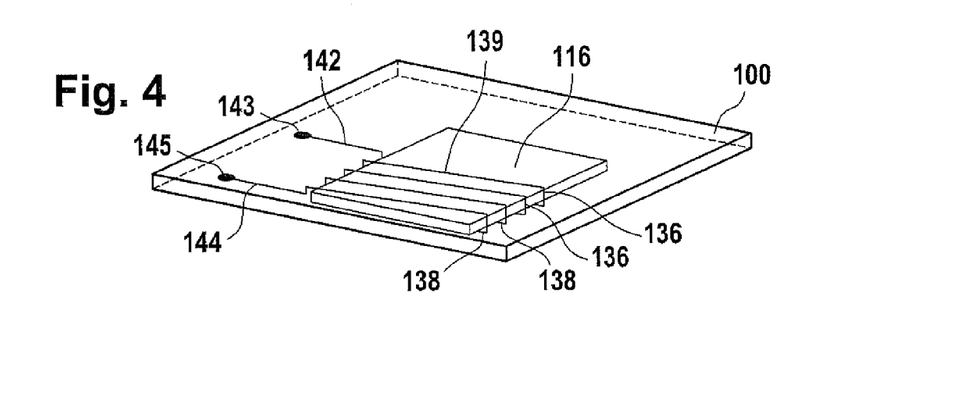
FIG. 4 shows a perspective view of the printed circuit board according to FIG. 3.

Once the coil core has been formed, that is to say for example once the paste 116 has cured, the first winding portions 136 are then applied to the flanks 112 and 114 of the resultant coil core, and the third winding portions 139 are applied to the upper face 148. The resultant printed circuit board 110 with the applied coil 100 is shown in FIG. 4 in a perspective view.

Figure 5:
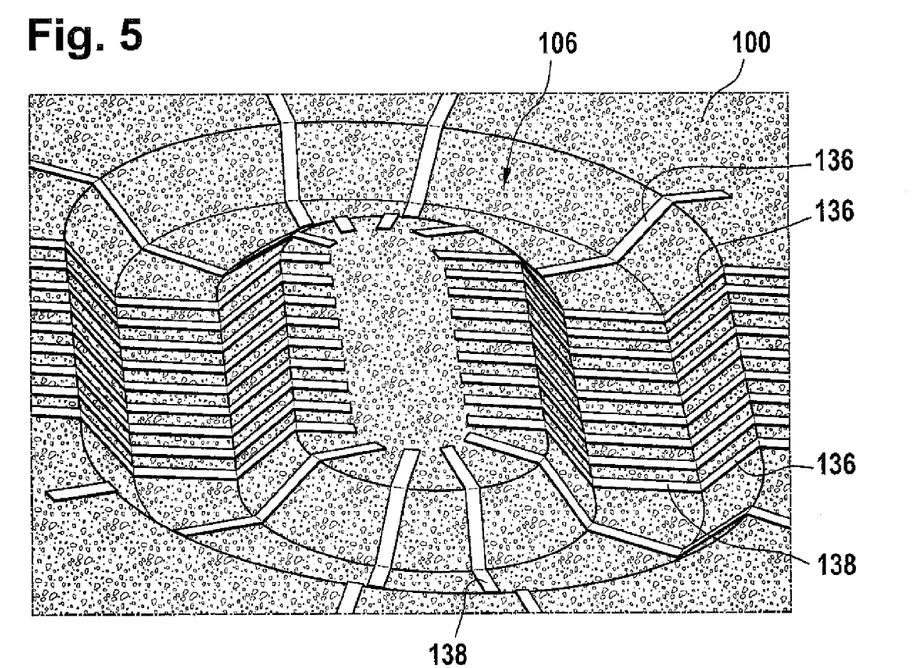
FIG. 5 shows a cavity with applied and first and second winding portions.

FIG. 5 shows an embodiment of the invention in which an oval annular coil is to be integrated into the substrate 100. To this end, an oval cavity 106 is milled into the substrate 100, wherein the substrate 100 is glass-fiber-reinforced. FIG. 5 shows an intermediate product with the integration of the coil 140 into the substrate 100, after which the first and second winding portions 136 and 138 respectively have been imprinted by means of a 3D printing method.

Figure 6:
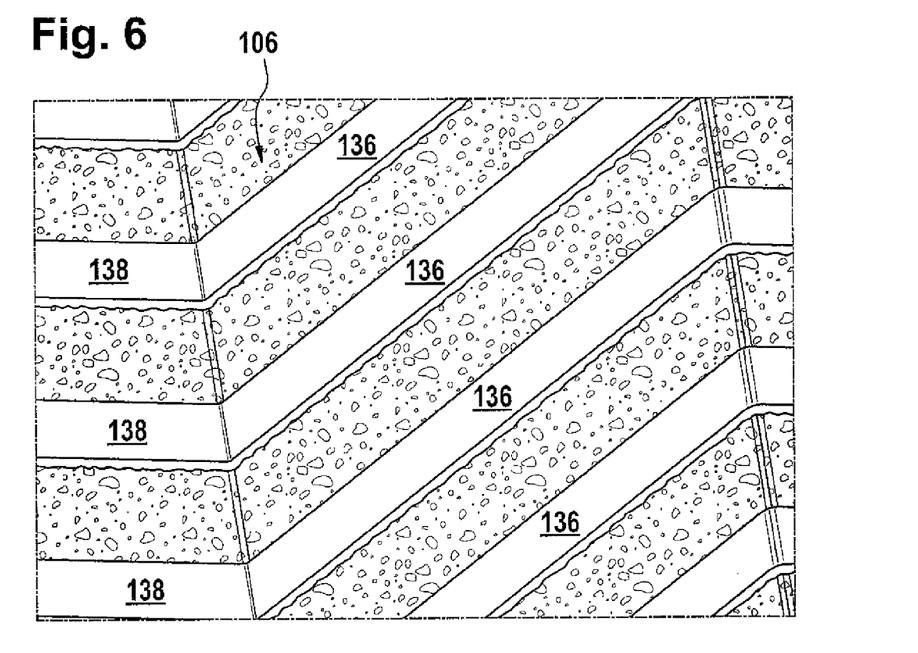
FIG. 6 shows an enlarged partial illustration of FIG. 5, which shows a portion of the base area and of a flank of the cavity.

FIG. 6 shows a partial view of FIG. 5 enlarged by five times, wherein the rough surface of the cavity 106 and the resultant irregular structure of the first and second winding portions 136 and 138 respectively can be seen.

The rough surface of the cavity 106 is caused by glass fibers of the substrate 100, which are severed as the cavity 106 is milled. The resultant irregular structuring of the winding portions 136 and 138 leads to a reduction of the effective cross-sectional area thereof, and therefore to an increase in the ohmic resistance, which ultimately leads to a reduction of the coil quality of the coil 140 to be produced.

Figure 7:
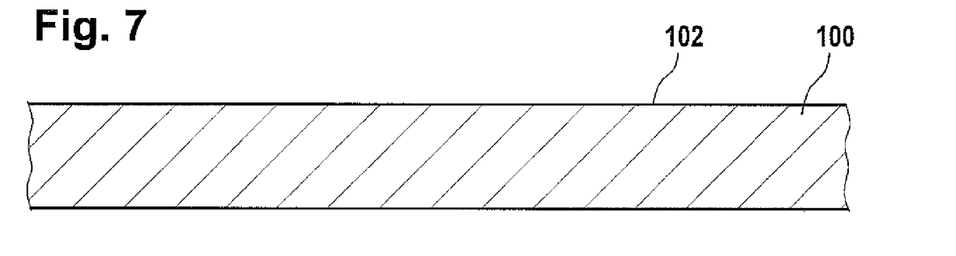
FIGS. 7-13 show an embodiment of a method for producing an electronic printed circuit board with an integrated toroidal or annular coil.
Figure 8:
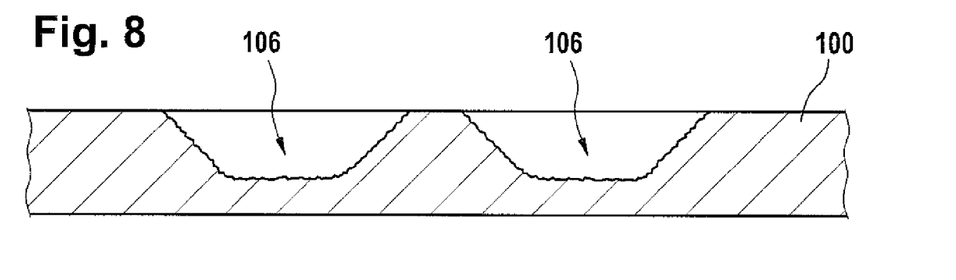

To remedy this problem, which may occur in the case of a substrate 100 having a glass fiber content, the following approach in accordance with the embodiment according to FIGS. 7 to 13 can be adopted:

The substrate 100 is first provided and is glass-fiber-reinforced, as illustrated in FIG. 7. The cavity 106 is then milled into the substrate 100, wherein glass fibers are severed during the milling process, thus leading to a high surface roughness of the resultant cavity 106 (FIG. 8).

Figure 9:
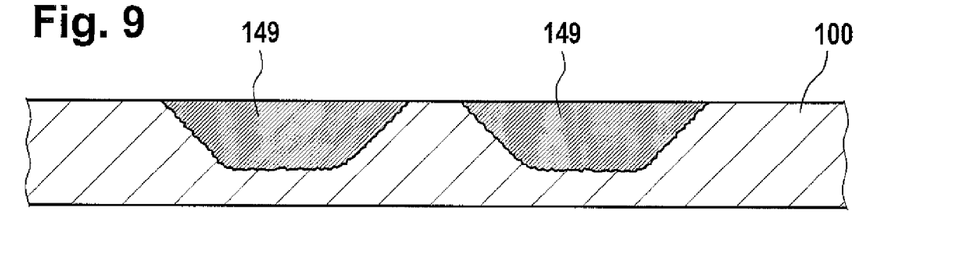
Figure 10:
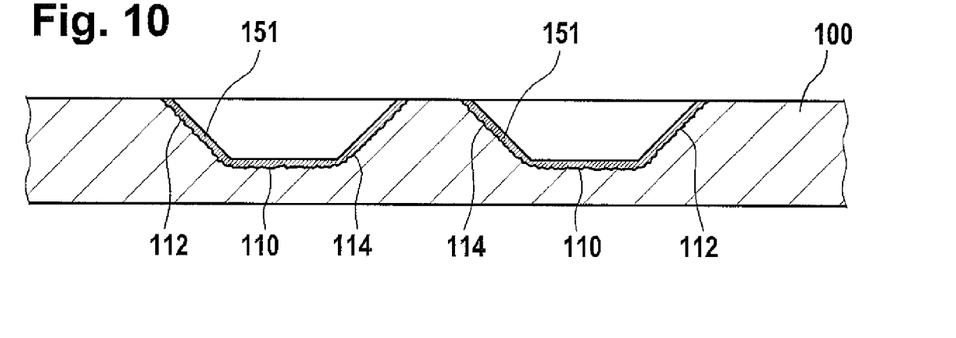

The cavity 106 is then filled with a material 149. This material 149 may be a resin for example. This is illustrated in FIG. 9.

The material 149 is then removed from the cavity 106 apart from a layer 151, for example likewise by means of milling. The layer 151 of the material 149 remaining on the surface of the cavity 106 may have a thickness from 10 μm to 20 μm, for example (see FIG. 10).

Figure 11:
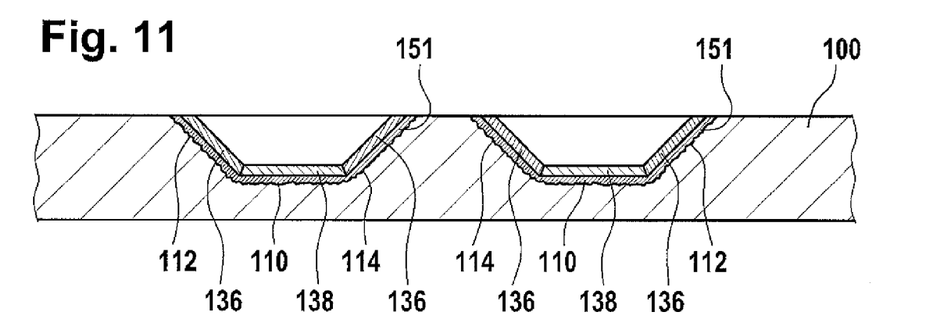
Figure 12:
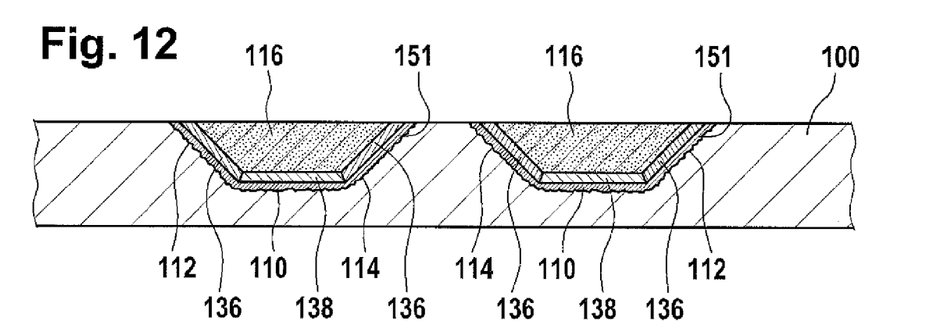
Figure 13:
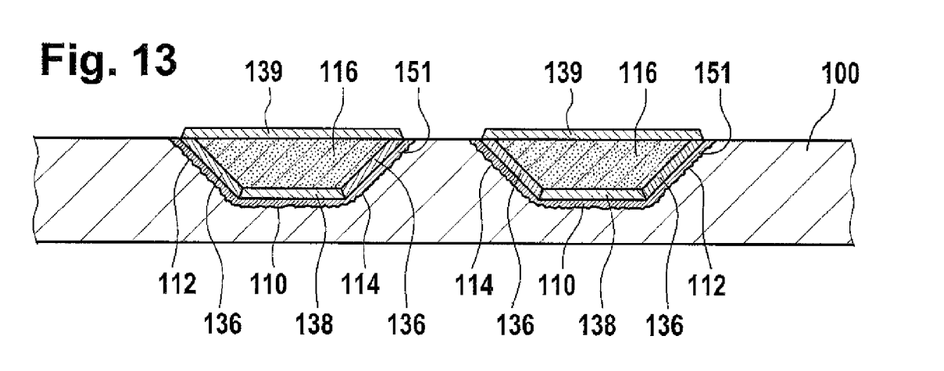

In the subsequent method steps illustrated in FIGS. 11, 12 and 13, the actual coil 140 is then produced by first applying the first and second winding portions to the flanks 112 and 114 of the cavity 106 coated by the layer 151 and to the base area 110 coated by the layer 151 (FIG. 11). The core material for forming the coil core is then introduced into the cavity 106, for example by dispensing the paste 116 into the cavity 106 in order to fill the cavity 106 with the paste 116 (FIG. 12).

The third winding portions 139 are then applied to the coil core thus formed.

Figure 14:
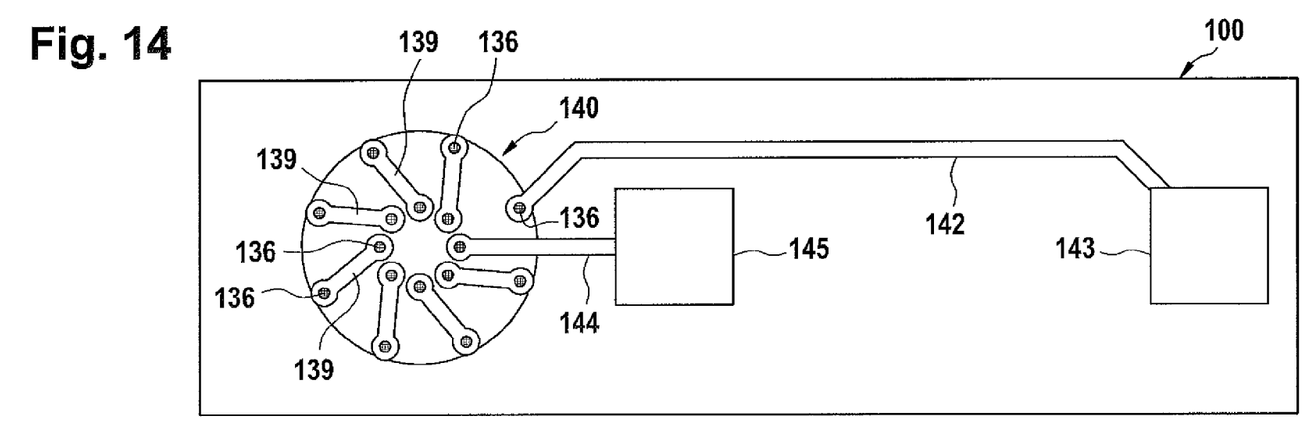
FIG. 14 shows a plan view of an embodiment of a printed circuit board according to the invention with an integrated annular coil.

FIG. 14 shows a plan view of the surface 102 of the substrate 100 with the third winding portions 139 running in this plane, said third winding portions each electrically interconnecting two second ends 147 of the second winding portions 136, wherein the coil 140 is formed here as an annular coil.

The first and last winding portions 139 of the coil 140 are connected here via conductive tracks 142 and 144 to contact faces 143 and 145 respectively.

The diameter of the coil 140 may be less than 5 mm, for example 3.5 mm.

Figure 15:
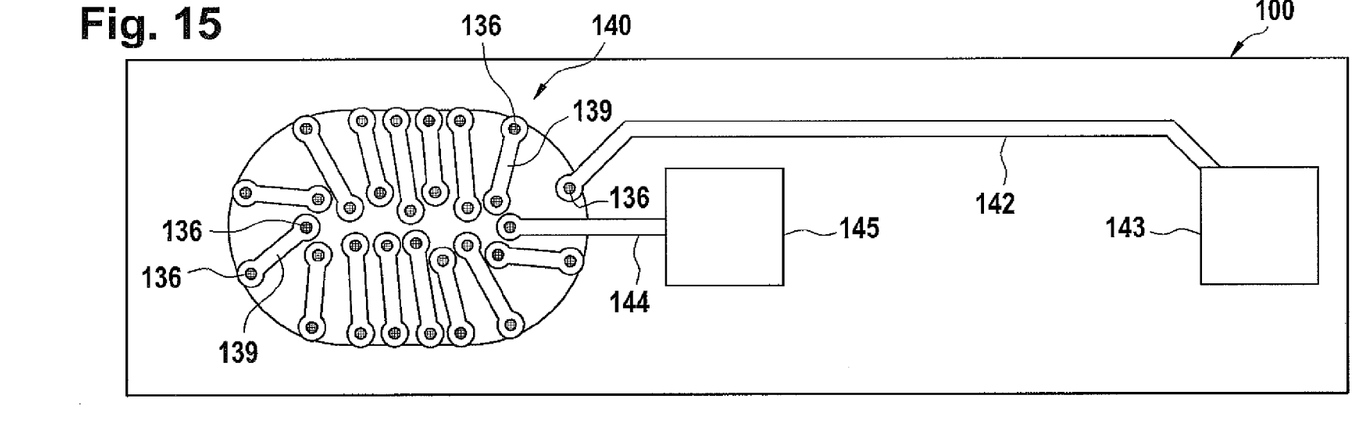
FIG. 15 shows a plan view of an embodiment of a printed circuit board according to the invention with an integrated oval coil.

FIG. 15 shows a corresponding coil 140 in an oval embodiment corresponding to the embodiment according to FIGS. 5 to 13.

LIST OF REFERENCE SIGNS 100 substrate
102 surface
106 cavity
110 base area
112 flank
114 flank
116 paste
136 first winding portion
138 second winding portion
139 third winding portion
140 coil
141 first end
142 conductive track
143 contact face
144 conductive track
145 contact face
147 second end
148 upper side
149 material
151 layer

The invention claimed is:

1. A method comprising:
producing a coil integrated in a substrate or applied to the substrate, wherein the coil has first winding portions, which each of the first winding portions has a first end and a second end, and wherein the coil has second winding portions and third winding portions, wherein each of the first winding portions has a first end and a second end by the second winding portions and two corresponding second ends of the first winding portions are electrically interconnected by the third winding portions, such that coil windings of the coil are thus formed, wherein at least the first winding portions are applied by a 3D printing process comprising at least one of an aerosol jet printing process and an inkjet printing process; and
producing a cavity in the substrate, wherein the first winding portions are applied to flanks of the cavity and the second winding portions are applied to a base of the cavity by the 3D printing process, wherein, after applying the first and second winding portions, the method comprises:
introducing a core material into the cavity; and
applying the third winding portions to the core material.

2. The method according to claim 1, further comprising applying the first winding portions and the second winding portions in a single printing process of the 3D printing method.

3. The method according to claim 1, wherein the substrate includes glass fibers and the cavity is produced in the substrate by means of a machining process, such that the glass fibers in the substrate located in an edge region of the cavity are severed by the machining process when producing the cavity, the method further comprising:

introducing a material into the cavity, wherein the material extends at least over the base and the flanks of the cavity;

partially removing the material from the cavity apart from a layer of the material extending over the base and the flanks of the cavity, wherein the first winding portions and the second winding portions are applied to the layer of material.

4. The method according to claim 3, wherein the material comprises at least one of a resin and a plastic.

5. The method according to claim 1, wherein the core material is introduced in the form of one of a paste and a solid into the cavity or is applied to the substrate in the form of the paste or the solid.

6. The method according to claim 1, wherein the substrate is a printed circuit board material of an electronic printed circuit board, in particular fiber-reinforced plastic.

7. The method according to claim 1, wherein the flanks of the cavity enclose one of a right angle and an acute angle with the base of the cavity.

8. The method according to claim 7, wherein the angle is between 30° and 60°, preferably 45°.

9. The method according to claim 1, wherein the core material includes ferromagnetic particles, in particular particles formed from at least one of a soft magnetic amorphous, a nanocrystalline alloy, and a ferrite.

10. The method according to claim 1, wherein the core material is pressed into the cavity in the form of a paste or is applied using a dispenser.

11. The method according to claim 1, wherein the second winding portions are applied by means of a structuring technique, in particular by etching.

12. The method according to claim 1, wherein a plurality of coils are produced in or on the substrate, and the coils are connected to form a sensor array.

13. The method according to claim 1, wherein the core material comprises a paste and the cavity is filled completely with the paste.

14. The method according to claim 13, wherein the paste is mixed during a drying process of the paste in order to cure the paste, in particular by means of shaking or by application of ultrasound.

15. A method comprising:
producing a coil integrated in a substrate or applied to the substrate, wherein the coil has first winding portions, which each of the first winding portions has a first end and a second end, and wherein the coil has second winding portions and third winding portions, wherein each of the first winding portions has a first end and a second end by the second winding portions and two corresponding second ends of the first winding portions are electrically interconnected by the third winding portions, such that coil windings of the coil are thus formed, wherein at least the first winding portions are applied by a 3D printing process comprising at least one of an aerosol jet printing process and an inkjet printing process; and producing a cavity in the substrate, wherein the first winding portions are applied to flanks of the cavity and the second winding portions are applied to a base of the cavity by the 3D printing process, wherein the substrate includes glass fibers and the cavity is produced in the substrate by means of a machining process, such that the glass fibers in the substrate located in an edge region of the cavity are severed by the machining process when producing the cavity, the method further comprising:

introducing a material into the cavity, wherein the material extends at least over the base and the flanks of the cavity; and partially removing the material from the cavity apart from a layer of the material extending over the base and the flanks of the cavity, wherein the first winding portions and the second winding portions are applied to the layer of material.

16. The method according to claim 15, further comprising applying the first winding portions and the second winding portions in a single printing process of the 3D printing method.

17. The method according to claim 15, wherein, after applying the first and second winding portions, the method comprises:

introducing a core material in the form of one of a paste and a solid into the cavity; and applying the third winding portions to the core material; and wherein the core material includes ferromagnetic particles, in particular particles formed from at least one of a soft magnetic amorphous, a nanocrystalline alloy, and a ferrite.

18. The method according to claim 17, wherein the paste is mixed during a drying process of the paste in order to cure the paste, in particular by means of shaking or by application of ultrasound.

19. The method according to claim 15, wherein the material comprises at least one of a resin and a plastic.

20. The method according to claim 15, wherein the flanks of the cavity enclose one of a right angle and an acute angle with the base of the cavity.

21. The method according to claim 15, wherein the second winding portions are applied by means of a structuring technique, in particular by etching.

22. The method according to claim 15, wherein a plurality of coils are produced in or on the substrate, and the coils are connected to form a sensor array.

* * * * *